(12) United States Patent
Janski et al.

(10) Patent No.: US 10,476,112 B2
(45) Date of Patent: Nov. 12, 2019

(54) METHOD OF MANUFACTURING A BATTERY, BATTERY AND INTEGRATED CIRCUIT

(71) Applicant: Infineon Technologies AG, Neubiberg (DE)

(72) Inventors: Rafael Janski, Villach (AT); Kamil Karlovsky, Villach (AT); Susanne Kraeuter, London (GB); Michael Sorger, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/210,454

(22) Filed: Jul. 14, 2016

(65) Prior Publication Data

US 2017/0018813 A1    Jan. 19, 2017

(30) Foreign Application Priority Data

Jul. 15, 2015 (DE) .......................... 10 2015 111 498

(51) Int. Cl.
| | |
|---|---|
| *H01M 10/42* | (2006.01) |
| *H01M 4/38* | (2006.01) |
| *H01L 27/06* | (2006.01) |
| *H01M 4/66* | (2006.01) |
| *H01M 10/052* | (2010.01) |
| *H01M 10/058* | (2010.01) |
| *H01M 6/40* | (2006.01) |

(52) U.S. Cl.
CPC ...... *H01M 10/425* (2013.01); *H01L 27/0688* (2013.01); *H01M 4/386* (2013.01); *H01M 4/661* (2013.01); *H01M 6/40* (2013.01); *H01M 10/052* (2013.01); *H01M 10/058* (2013.01)

(58) Field of Classification Search
None
See application file for complete search history.

(56) References Cited

U.S. PATENT DOCUMENTS

| | | | |
|---|---|---|---|
| 2004/0154160 A1* | 8/2004 | Hong | H01M 10/0404 29/730 |
| 2007/0264564 A1* | 11/2007 | Johnson | H01L 23/58 429/161 |
| 2007/0275300 A1 | 11/2007 | Salot et al. | |

(Continued)

FOREIGN PATENT DOCUMENTS

| | | |
|---|---|---|
| DE | 102015104765 A1 | 10/2015 |
| DE | 102015104800 A1 | 10/2015 |

*Primary Examiner* — Carmen V Lyles-Irving
(74) *Attorney, Agent, or Firm* — Murphy, Bilak & Homiller, PLLC

(57) ABSTRACT

A method of manufacturing a battery includes defining an active region and a bonding area in a first main surface of a first semiconductor substrate, forming a first ditch in the bonding area, forming an anode at the first semiconductor substrate in the active region, and forming a cathode at a carrier comprising an insulating material. The method further includes stacking the first semiconductor substrate and the carrier so that the first main surface of the first semiconductor substrate is disposed on a side adjacent to a first main surface of the carrier, a cavity being formed between the first semiconductor substrate and the carrier, and forming an electrolyte in the cavity.

13 Claims, 15 Drawing Sheets

(56) References Cited

U.S. PATENT DOCUMENTS

| | | | |
|---|---|---|---|
| 2010/0003580 A1* | 1/2010 | Shirahama | H01M 8/0276 |
| | | | 429/492 |
| 2013/0128488 A1* | 5/2013 | Forster | H01M 10/0436 |
| | | | 361/820 |
| 2015/0280288 A1 | 10/2015 | Rajaraman et al. | |
| 2015/0280289 A1 | 10/2015 | Karlovsky et al. | |

* cited by examiner

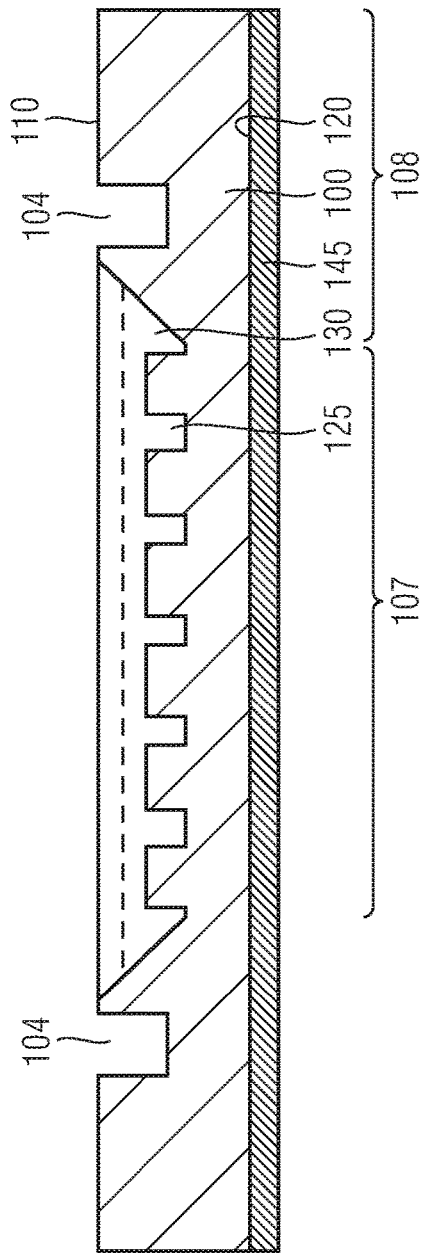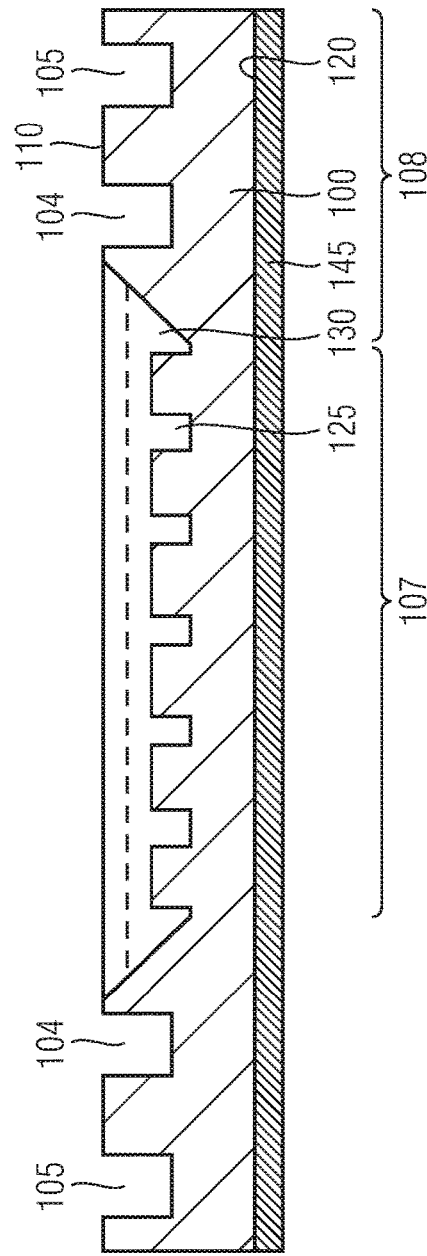

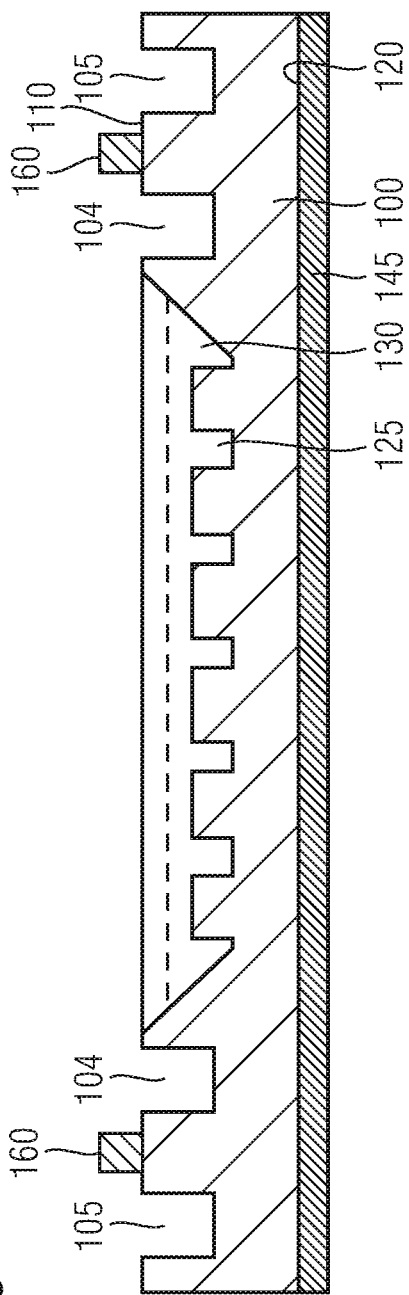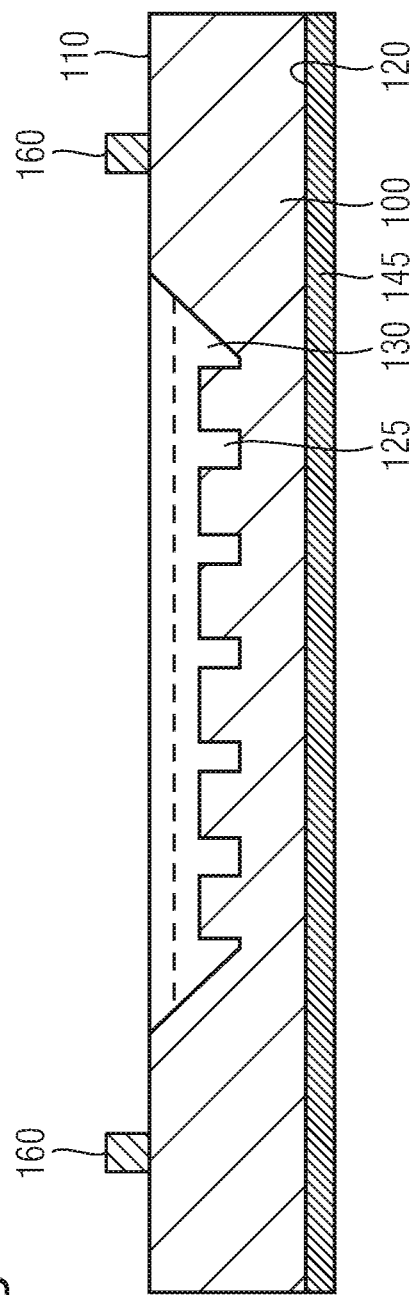

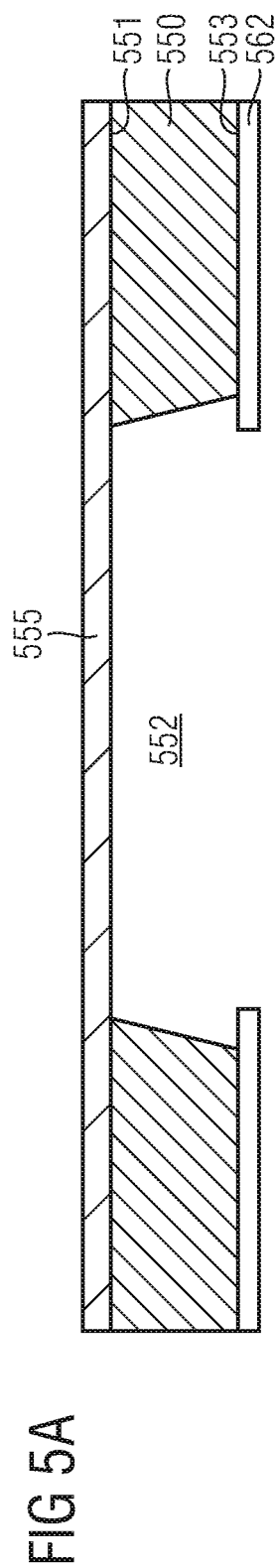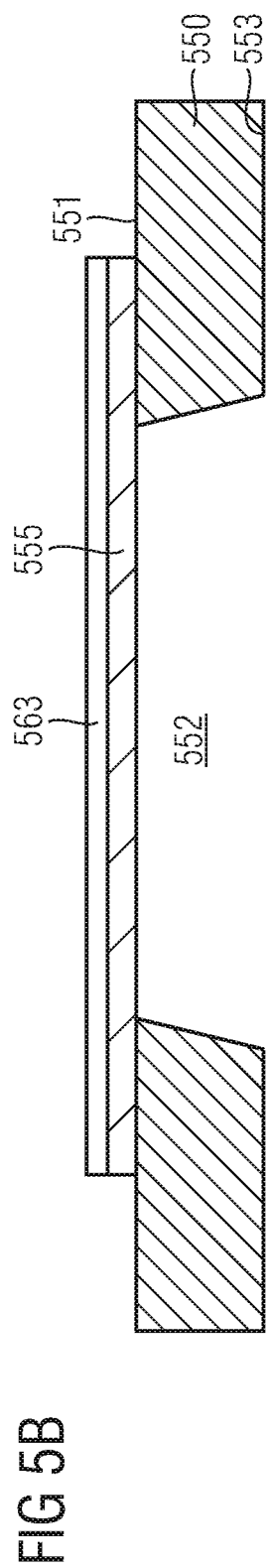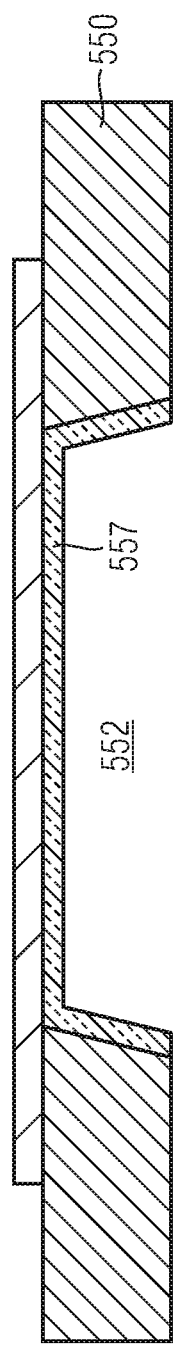

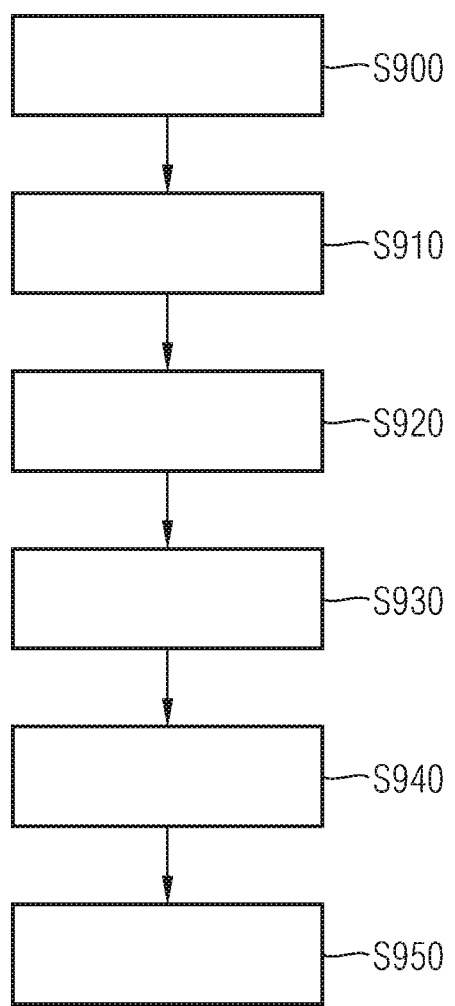

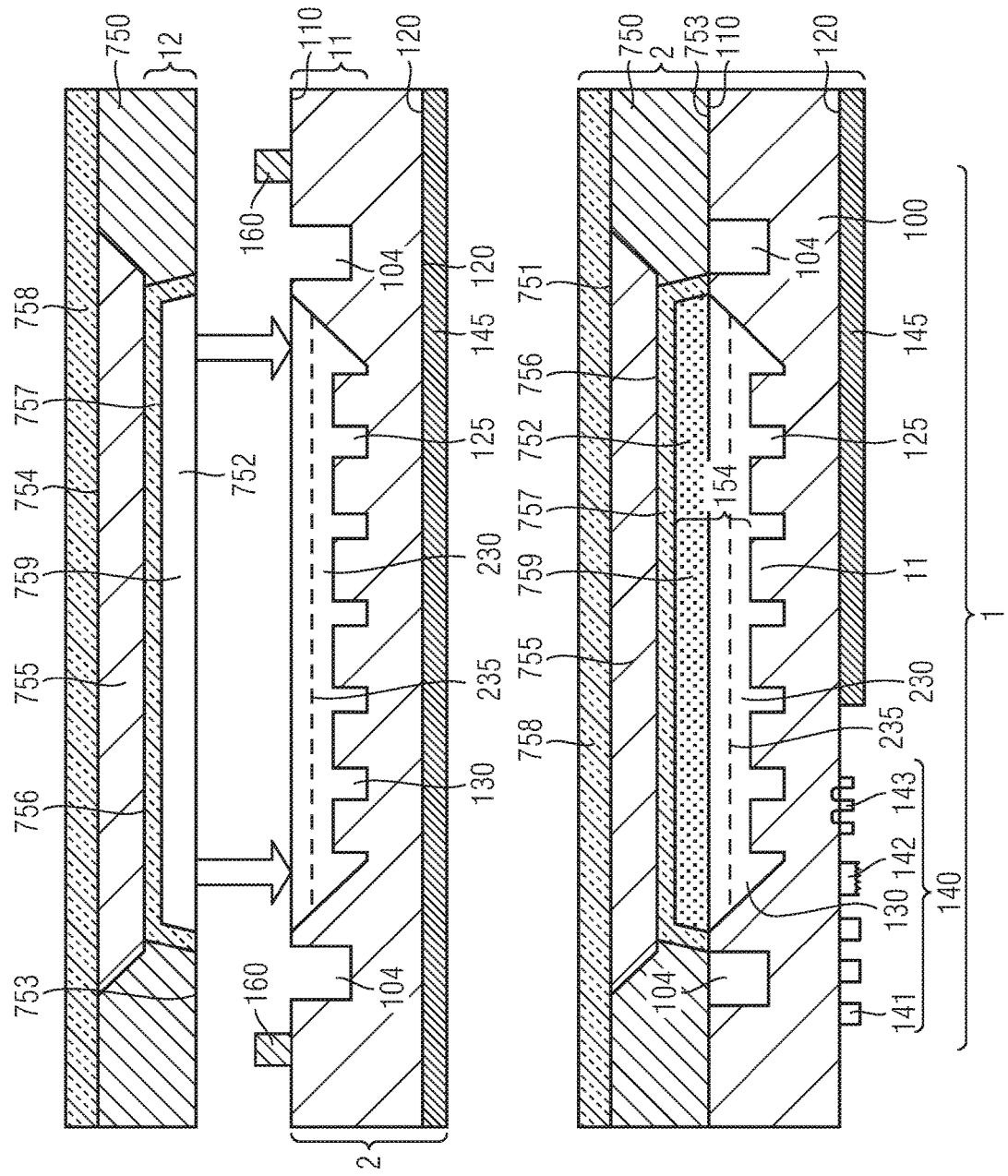

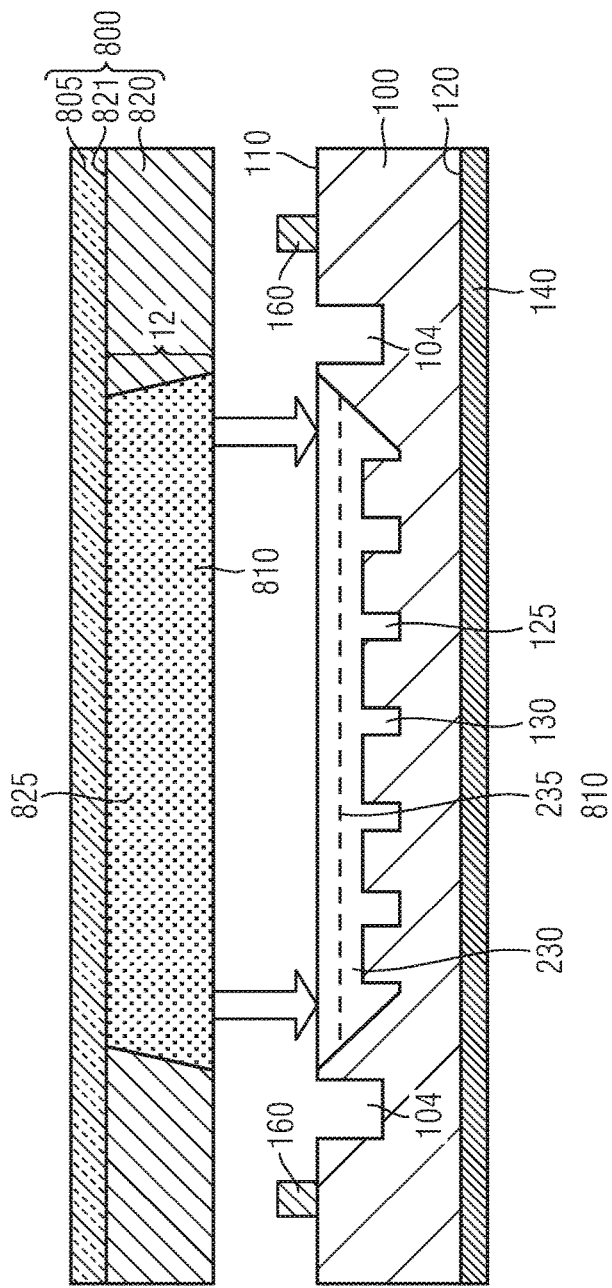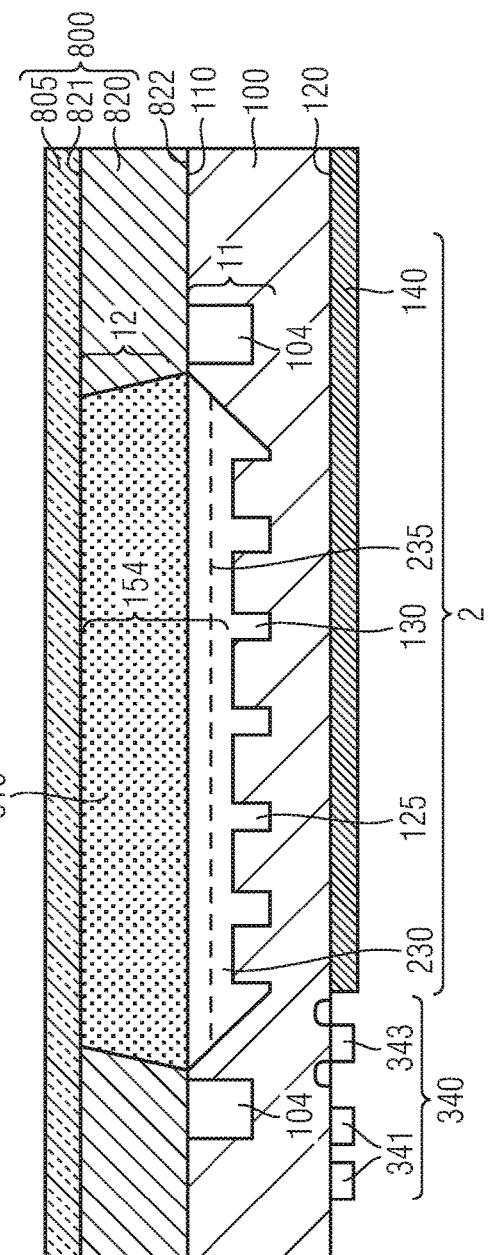

METHOD OF MANUFACTURING A BATTERY, BATTERY AND INTEGRATED CIRCUIT

PRIORITY CLAIM

This application claims priority to German Patent Application No. 10 2015 111 498.4 filed on 15 Jul. 2015, the content of said application incorporated herein by reference in its entirety.

BACKGROUND

With the increased use of portable electronic devices such as notebooks, portable telephones, cameras and others and with the increased use of current-driven automobiles, lithium ion secondary batteries with high energy density have attracted increasing attention as a power source.

Further, attempts are being made for providing semiconductor devices or semiconductor-based devices having an integrated power source.

Lithium ion secondary batteries typically include a cathode comprising a lithium-containing transition metal oxide or the like, an anode typically made of a carbon material and a non-aqueous electrolyte containing a lithium salt as well as a separator situated between the anode and the cathode.

In order to meet the increasing demands on capacity and performance, new concepts for lithium batteries that can be manufactured in a simple manner are desirable.

SUMMARY

According to an embodiment, a method of manufacturing a battery comprises defining an active region and a bonding area in a first main surface of a first semiconductor substrate, forming a first ditch in the bonding area, forming an anode at the first semiconductor substrate in the active region, forming a cathode at a carrier comprising an insulating material, stacking the first semiconductor substrate and the carrier so that the first main surface of the first semiconductor substrate is disposed on a side adjacent to a first main surface of the carrier, a cavity being formed between the first semiconductor substrate and the carrier, and forming an electrolyte in the cavity.

According to an embodiment, a battery comprises a first semiconductor substrate having a first main surface, the first main surface comprising an active region and a bonding area, a first ditch being formed in the bonding area, an anode at the first semiconductor substrate in the active region, a carrier comprising an insulating material, the carrier having a first main surface, and a cathode at the carrier. The first semiconductor substrate and the carrier are stacked so that the first main surface of the first semiconductor substrate is disposed on a side adjacent to the first main surface of the carrier, and a cavity is formed between the first semiconductor substrate and the carrier. The battery further comprises an electrolyte in the cavity.

According to an embodiment, a method of manufacturing a battery comprises defining an active region and a bonding area in a first main surface of a first semiconductor substrate, forming an anode at the first semiconductor substrate in the active region, forming a cathode at a carrier comprising an insulating material, applying an adhesive to the bonding area, stacking the first semiconductor substrate and the carrier so that the first main surface of the first semiconductor substrate is disposed on a side adjacent to a first main surface of the carrier and a cavity is formed between the first semiconductor substrate and the carrier. The method further comprises curing the adhesive by applying UV-radiation to a sidewall of the carrier, the sidewall being perpendicular to the first main surface of the first semiconductor substrate, and forming an electrolyte in the cavity.

According to an embodiment, a battery comprises a first semiconductor substrate having a first main surface, an anode at the first semiconductor substrate, a carrier comprising an insulating material, the carrier having a first main surface, a cathode at the carrier, a conducting or semiconductor layer over the carrier, on a side opposite to the first main surface of the carrier, the conducting or semiconductor layer extending along the entire width of the carrier, the conducting or semiconductor layer being electrically coupled to the cathode. The first semiconductor substrate and the carrier are stacked so that the first main surface of the first semiconductor substrate is disposed on a side adjacent to the first main surface of the carrier, a cavity being formed between the first semiconductor substrate and the carrier. The battery further comprises an electrolyte in the cavity.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIGS. 2A to 2D illustrate details of a bonding process.

FIGS. 5A to 5D illustrate a further method of manufacturing an integrated circuit including a lithium ion battery according to an embodiment.

FIGS. 7A to 7C illustrate flow diagrams of methods according to embodiments.

FIG. 8A illustrates a further embodiment of a method of manufacturing a battery.

FIG. 8B illustrates an integrated circuit according to an embodiment.

FIG. 9A illustrates a further embodiment of a method of manufacturing a batter.

FIG. 9B illustrates an integrated circuit according to an embodiment.

Figure 1A:
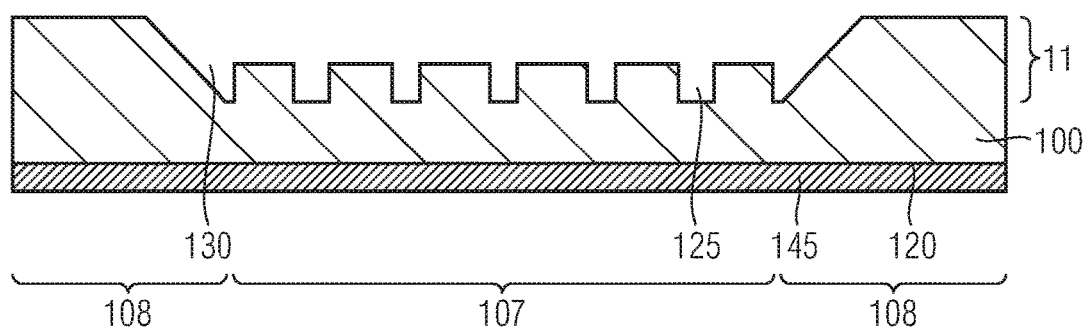
FIGS. 1A to 1F illustrate process features of a method of manufacturing a battery.

Those skilled in the art will recognize additional features and advantages upon reading the following detailed description, and upon viewing the accompanying drawings.

DETAILED DESCRIPTION

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

A method of manufacturing a battery according to an embodiment will be explained in the following. The method employs a semiconductor substrate. Accordingly, general semiconductor processing methods may be employed. For example, the semiconductor processing methods may be performed on a wafer level so as to manufacture a plurality of batteries in parallel. After manufacturing the batteries, the single batteries may be isolated or separated by performing a wafer dicing or sawing process. For example, methods for manufacturing miniaturized sizes can effectively applied for manufacturing a battery having a small size in comparison to conventional batteries. Further, components of integrated circuits may be easily integrated with the battery. The following description describes a general embodiment of a method of manufacturing a battery. Specific examples of materials employed will be discussed later with reference to FIG. 6A.

A first semiconductor substrate 100 which may comprise silicon is processed to form an anode 11 of a lithium ion battery. In particular, a depression 130 may be formed, followed by trenches 125 so as to form a patterned surface. For example, the depression 130 may have a depth of 0 to 200 μm. The trenches may have a width of 15 to 60 μm, e.g. 25 to 50 μm. Further, the trenches may have a distance of 30 to 100 μm, e.g. 40 to 80 μm, for example, 50 μm. For example, an active region 107 and a bonding area 108 may be defined in the first main surface 110 of the first substrate. Generally speaking, components for implementing the functionality of the battery are to be disposed within the active area 107. For example, the anode is disposed within the active area 107. Further, the electrolyte is to be disposed in or adjacent to the active area. For example, the depression 130 for forming a cavity is formed in the active area 107. Moreover, the bonding area 108 is disposed at an edge portion of the first semiconductor substrate or the resulting battery. For example, as will be discussed in more detail with reference to FIG. 3A, the bonding area may enclose the active area. The active area 107 may be disposed in a central area of the first semiconductor substrate or the resulting battery.

A back side metallization (element) 145 may be formed on the second main surface 120 of the first semiconductor substrate 100. FIG. 1A illustrates a cross-sectional view of an example of a resulting first substrate 100.

Figure 1B:
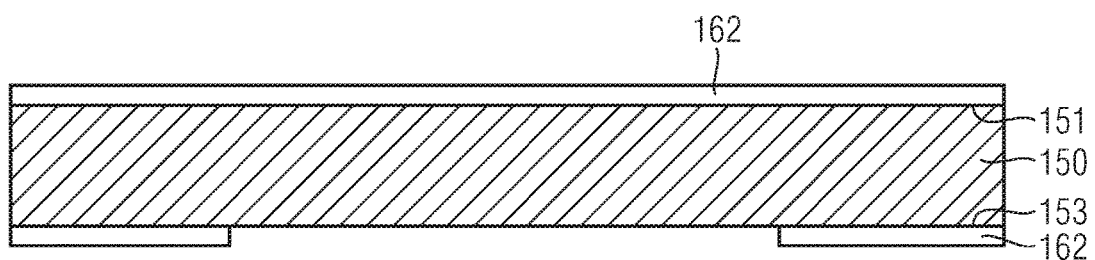

Then, a carrier 150 comprising an insulating material is processed to form a cathode. For example, the carrier 150 may be a glass wafer or any other wafer made of an insulating material. For example, a hard mask layer 162 is formed adjacent to a first main surface 153 and a second main surface 151 of the carrier 150. The hard mask layer 162 is patterned to form an opening for etching an opening in the glass carrier (FIG. 1B).

Figure 1C:
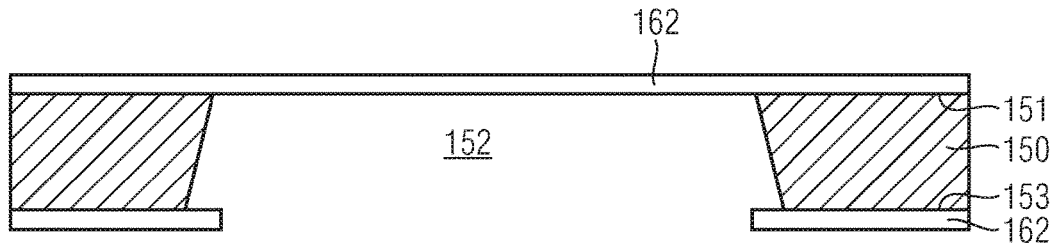

Thereafter, an etching step, e.g. using HF (hydrofluoric acid) as an etchant is performed so as to form an opening 152 in the carrier 150. The opening 152 is formed so as to extend from the first main surface 153 to the second main surface 151 (FIG. 1C).

Figure 1D:
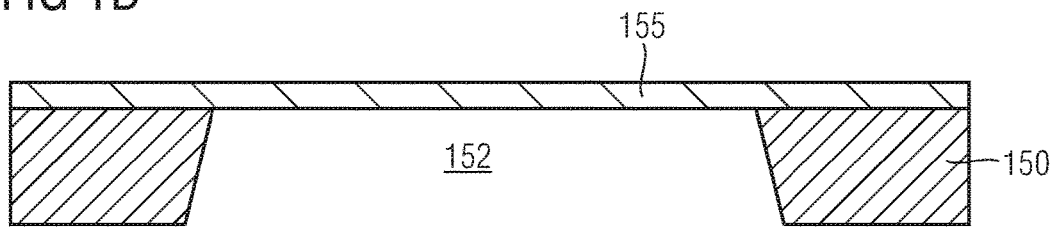

After removing the residues of the hard mask layer 162, a planar second substrate 155 comprising a semiconductor or conductive material may be bonded with the carrier, e.g. using anodic bonding or another bonding method suitable for bonding planar surfaces. (FIG. 1D)

Figure 1E:
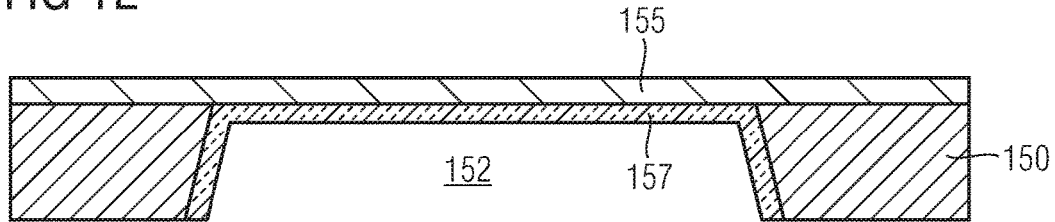

Thereafter, a protective conductive layer 157 such as an aluminium layer may be formed on the surface of the resulting opening 152. Any material that may prevent a contact of the lithium source and the material of the second substrate 155 may be used as the material of the protective conductive layer 157. Due to the presence of the protective conductive layer 157, diffusion of the lithium atoms in the material of the second substrate 155 may be prevented. This is useful in case the second substrate 155 comprises a semiconductor material. FIG. 1E shows a cross-sectional view of a resulting structure.

Figure 1F:
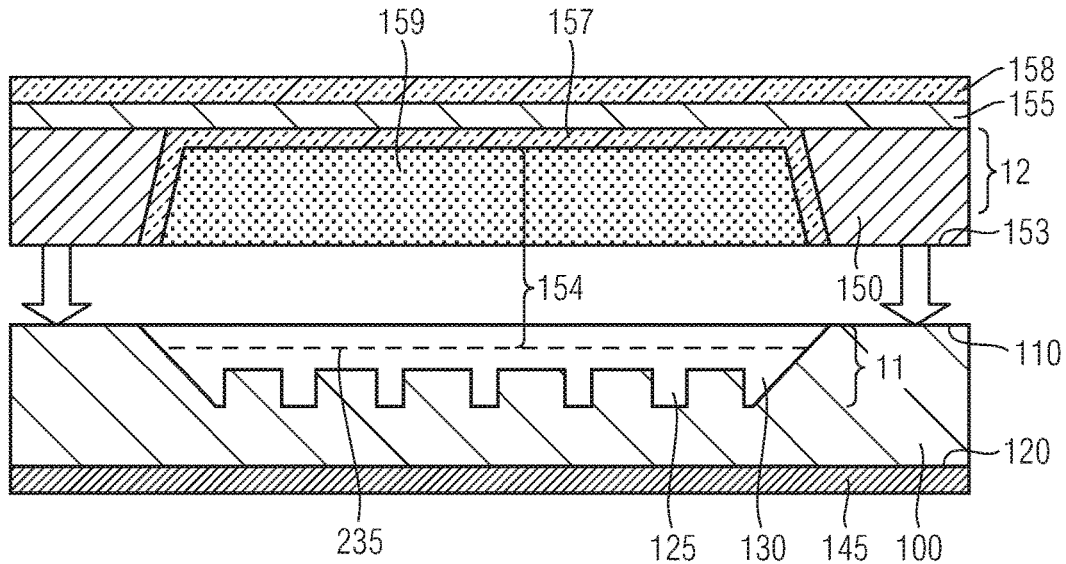

A conductive layer 158 is formed on the top surface of the second substrate 155 so as to provide an electrical contact. Further, a lithium source 159 is filled into the opening 152. When assembling the first substrate 100 and the carrier 150, a cavity 154 is formed. According to the embodiment, the cavity 154 is formed between the first substrate 100, the carrier 150 and the semiconductor wafer 155. An electrolyte 230 and a separator element 235 are filled in the cavity 154. Thereafter, the first main surface 153 of the carrier 150 is bonded to the first main surface 110 of the first substrate 100 as indicated by the downward facing arrows in FIG. 1F. For example, this may be accomplished using an UV curable adhesive.

The process of bonding the carrier to the first substrate 100 will be explained in more detail with reference to the following Figures. Ditches 104, 105 are defined in the first main surface 110 of the bonding area 108. For example, only one ditch 104 may be formed as is shown in FIG. 2A. For example, the ditch 104 may be disposed adjacent to the active area 107 or adjacent to an edge portion of the first semiconductor substrate 100. The ditch 104 may be formed so as to continuously surround the active area 107. According to a further embodiment, the ditch 104 may be interrupted.

FIG. 2B shows an embodiment according to which a first ditch 104 is disposed adjacent to the active area 107 and a second ditch 105 is disposed adjacent to the lateral border of the first semiconductor substrate or the resulting battery. The ditches 104, 105 may be, e.g. formed by etching, e.g. wet etching or plasma etching. For example, the ditches 104, 105 may have depth of approximately 100 to 300 µm, e.g. 150 to 250 µm. A width may be 150 to 250 µm or 450 to 550 µm, e.g. 470 to 520 µm. When they are formed by plasma etching, they may have a width and a depth as indicated above. According to a further embodiment, they may have a depth of approximately 30 to 80 µm, e.g. 40 to 60 µm. A width of the ditches may be 20 to 40 µm, e.g. 25 to 35 µm. A distance between the ditches may be 2 to 3 mm, if they have a depth of more than 100 µm. If they have a depth of less than 100 µm, a distance may be approximately 1 to 2 mm, e.g. 1.6 mm.

FIG. 2C shows an adhesive which is applied to the first main surface 110 of the first substrate 100. For example, the adhesive may be cured using UV radiation after assembling the battery. The adhesive may be applied in a patterned manner. In particular, the adhesive may be locally applied, e.g. by printing process such as screen printing, stencil printing or inkjet printing. As a consequence, no separate patterning of the adhesive is necessary. Further, the amount of glue can be perfectly adjusted and a topography in the substrate may be reduced. When the first substrate 100 is bonded to the carrier 150 as indicated by the arrows in FIG. 1F, undue glue can be collected in the ditches. As a consequence, glue is prevented from mixing with the electrolyte which may be useful in case the electrolyte is a liquid electrolyte. Further, due to the presence of the ditches 105, the undue glue can be collected in the second ditches 105. Thereby, the formation of a sawing track between anode and cathode and between adjacent battery stacks may be prevented and the sawing process after completing the manufacture of the battery may be further simplified.

FIG. 2D shows an embodiment according to which the adhesive is locally applied without forming the ditches 104, 105. Also according to this embodiment, the method of bonding the first substrate 100 to the carrier 150 has the advantage that no patterning process of patterning the adhesive is necessary after applying the adhesive.

Figure 3A:
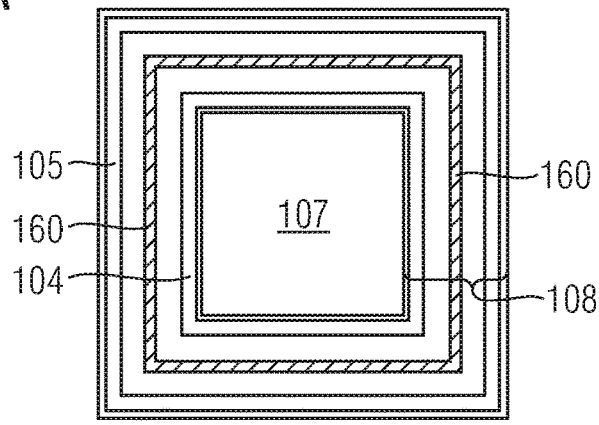
FIGS. 3A and 3B illustrate further details of the bonding process.
Figure 3B:
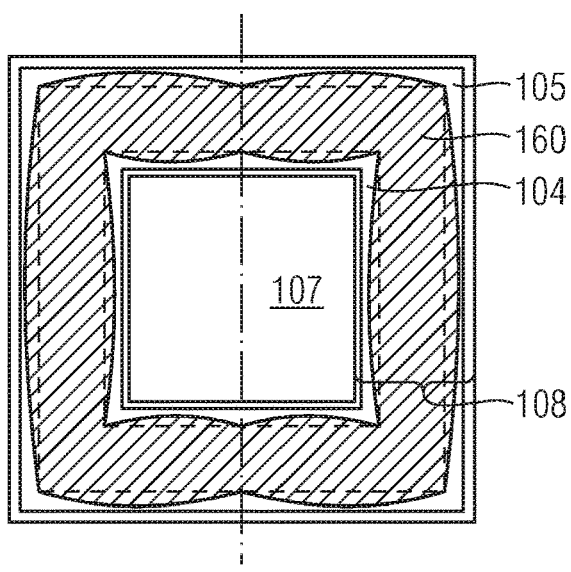

FIG. 3A illustrates a plan view of the first substrate after locally applying the adhesive 160, e.g. by a printing process, whereas FIG. 3B illustrates a plan view after bonding the substrate 100 to the carrier 150. As is shown, the ditches 104, 105 enclose the active area 107. The first ditch 104 is disposed adjacent to the active area 107, whereas the second ditch 105 is disposed at an outer edge portion of the bonding area 108. The adhesive 160 is disposed between the first ditch 104 and the second ditch 105. After performing the bonding process, the adhesive has spread and has been collected in the ditches 104, 105. As a consequence, the adhesive does not mix with the electrolyte, nor does the adhesive 160 spread outside the bonding area or outside the first semiconductor substrate.

Due to the presence of the first and second ditches, the battery may be better protected from penetrating humidity. For example, the diffusion length of humidity is enlarged. Further, the adhesive present in the ditches may be absorb humidity. As a consequence, humidity is prevented from entering the battery, whereby the lifetime of the battery may be increased. Further, due to the feature that the adhesive is only locally applied, threads of adhesive may be very thin whereby possibilities of humidity for penetrating onto the battery may be reduced.

Adhesives which may be cured using UV radiation may be cured at reduced temperatures in comparison to thermally curable adhesives. Accordingly, the thermal budget of the battery is not challenged. For example, acrylate adhesives may be used. For example, these adhesives may not contain solvents, so that the solvent may not react with the electrolyte, e.g. the liquid electrolyte.

Figure 4:
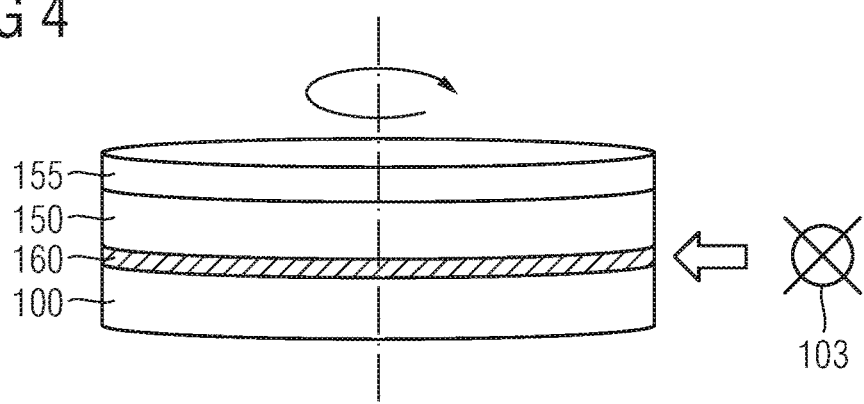
FIG. 4 illustrates an example of a curing process.

According to an embodiment, UV radiation for curing the adhesive may be introduced via a sidewall of the carrier comprising an insulating material. FIG. 4 shows an example of a corresponding configuration. As is shown, the carrier 150 is stacked over the first semiconductor substrate 100. The second substrate 155 stacked over the carrier 150. The UV curable adhesive 160 is disposed between the first semiconductor substrate 100 and the carrier 150. A UV source 103 is disposed in a lateral direction with respect to the stacking direction of the first semiconductor substrate 100 and the carrier 150. The UV source 103 emits UV light which is guided along the interface between the carrier and the adhesive and further along the carrier over the adhesive layer. As a result, it is possible to introduce the UV light via the carrier into the inner portion of the stacked semiconductor substrate and carrier which allows curing of the adhesive from a central portion of the layer stack. Due to the presence of the insulating carrier which is transparent for the UV light, the UV light may be guided into the interior of the layer stack. For example, irradiation with UV radiation may be performed for approximately 1 h.

Figure 5D:
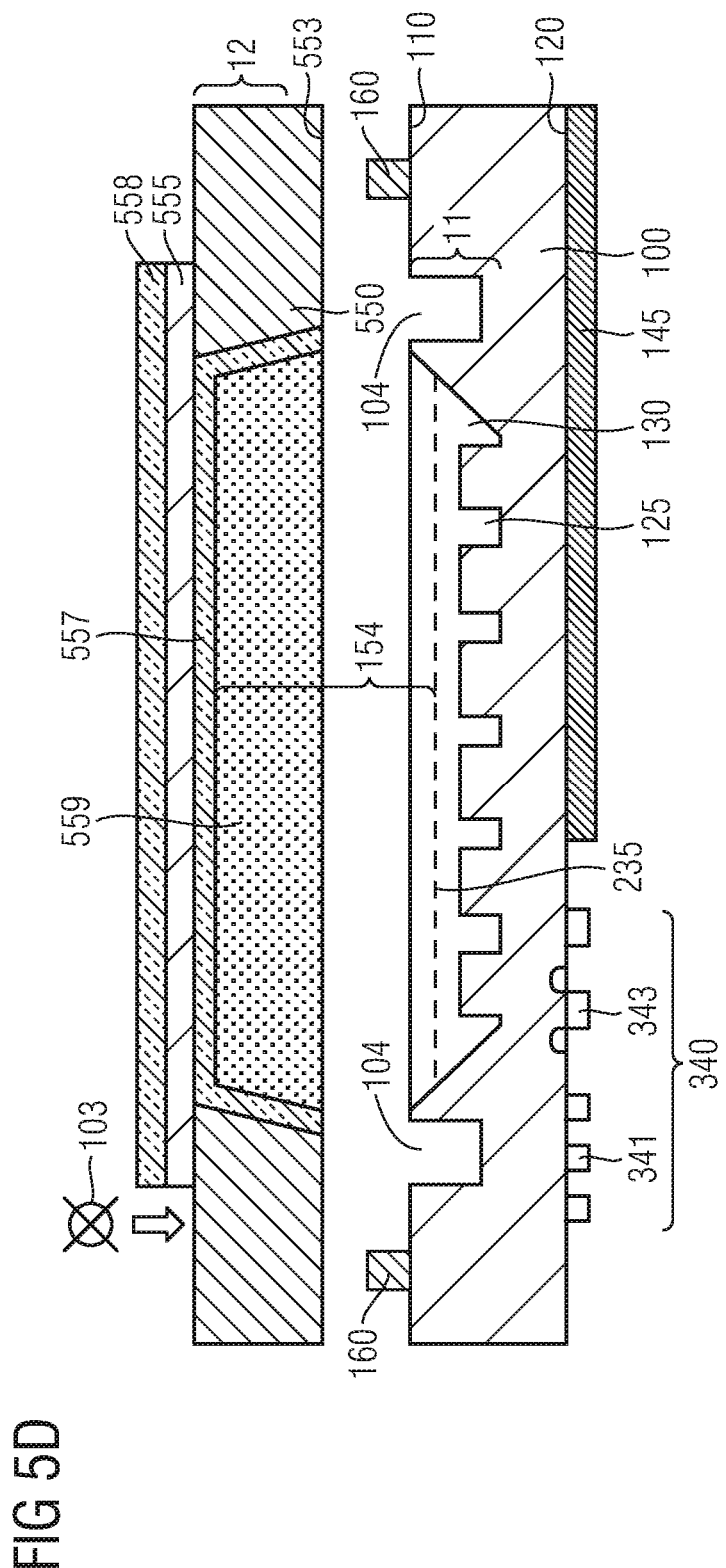

FIGS. 5A to 5D illustrate an alternative process flow for producing a battery when UV light is not introduced from a lateral side but from a top side of the wafer stack. Although FIG. 5D shows only one ditch 104, it is clearly to be understood that one or more further ditches 107 may be formed in the first main surface 110 of the semiconductor substrate 100. FIG. 5A shows a planar second substrate 555 (e.g. semiconductor substrate or conductive layer) that is bonded to a carrier 550 comprising an insulating material similar to the carrier 150 and the planar semiconductor wafer 155 shown in FIG. 1D after etching an opening 552 in the carrier.

Thereafter, a further hardmask layer 563 is formed on the top surface 556 of the second substrate 555. The hardmask layer 563 is patterned so as to form a hardmask, thereby leaving the edge portions of the second substrate 555 uncovered. Then, an etching step of etching the second substrate is performed to uncover portions of the second main surface 551 of the carrier 550. Due to this patterning step, the edge portions of the combined substrates becomes transparent for UV light which enables curing from the top side using an UV curable adhesive.

FIG. 5B shows an example of a resulting structure. According to a modification of the method describe above, the carrier 550 may first be patterned, e.g. by etching the opening 552, followed by attaching the carrier 550 to the second substrate 555. According to an implementation, the above steps of removing an edge portion of the second substrate 555 may be performed in the manner as has been described above. Alternatively, the carrier 550 may be attached to the second substrate 555 in a manner so that an edge portion of the carrier 550 is not covered by the second substrate 555.

Thereafter, a protective conductive layer 557 such as an aluminium layer may be formed on the surface of the resulting opening 552. Any material that may prevent a contact of the lithium source and the material of the second substrate 555 may be used as the material of the protective conductive layer 557. Due to the presence of the protective conductive layer 557, diffusion of the lithium atoms in the second substrate 555 may be prevented which is useful when the second substrate 555 comprises a semiconductor material. FIG. 5C shows an example of a resulting structure.

A conductive layer 558 is formed on the top surface of the second substrate 555 so as to provide an electrical contact while leaving the edge portions of the top surface of the carrier 550 uncovered. Further, the lithium source 559 is filled into the opening 552. When assembling the first semiconductor substrate 100, the carrier 550 and the second substrate 555, a cavity 554 is formed. The electrolyte 230 and the separator element 235 are filled in the cavity 554. Thereafter, the first main surface 553 of the carrier 550 is bonded to the first main surface 110 of the first substrate 100 as indicated by the downward facing arrows in FIG. 5D. For example, this may be accomplished using an UV curable adhesive in the manner, as has been explained above with reference to FIGS. 2A to 2D, 3A and 3B. Thereafter, a curing step using UV radiation is performed. As is illustrated in FIG. 5D, this curing step may be performed from the top side of the second substrate 555.

Figure 6A:
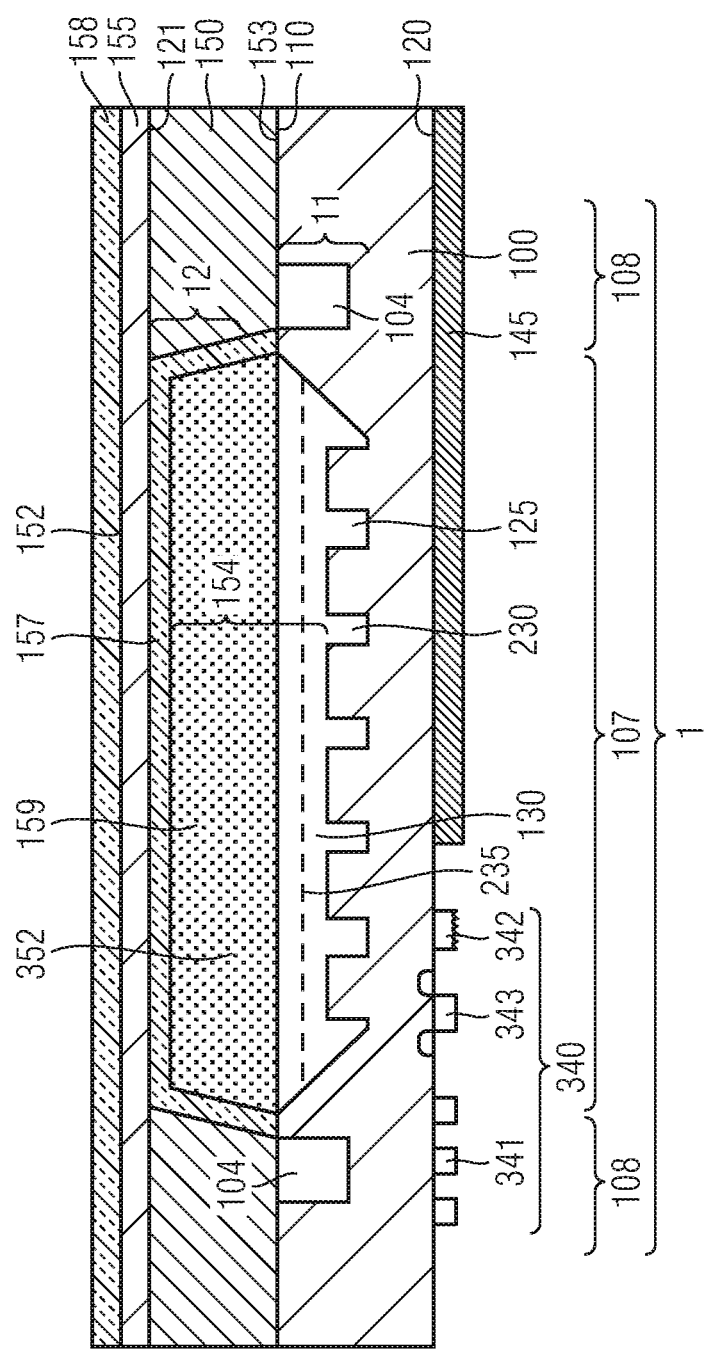
FIGS. 6A and 6B illustrate integrated circuits including a lithium ion battery according to embodiments.

FIG. 6A shows a cross-sectional view of an example of a battery 2 according to an embodiment. The battery 2 of FIG. 6A may be implemented as a lithium ion battery. The battery 2 shown in FIG. 6A comprises a first semiconductor substrate 100 having a first main surface 110, the first main surface 110 comprising an active region 107 and a bonding area 108, a first ditch 104 being formed in the bonding area 108. The battery further comprises an anode 11 at the first semiconductor substrate 100 in the active region 107 of the first main surface 110 of the first semiconductor substrate 100. The battery further includes a carrier 150 comprising an insulating material, the carrier 150 having a first main surface 153. The battery comprises a cathode 12 at the carrier 150. The semiconductor substrate 100 and the carrier 150 are stacked so that the first main surface 110 of the first semiconductor substrate is disposed on a side adjacent to the first main surface 153 of the carrier 150. A cavity 130 is formed between the semiconductor substrate 100 and the carrier 150. The battery further comprises an electrolyte 230 in the cavity 130.

According to an embodiment, the battery may further comprise a second ditch 105 in the bonding area 108.

According to all embodiments, the anode 11 may be integrally formed with the first semiconductor substrate and may comprise a semiconductor material. The first semiconductor substrate may be a silicon substrate. For example, the anode 11 may comprise silicon material which may be monocrystalline, polycrystalline or amorphous. The silicon material may be doped with any dopant as is conventionally used such as boron (B), arsenic (As), phosphorous (P), antimony (Sb), gallium (Ga), indium (In) or selenium (Se). The active silicon surface of the anode 11 may be planar or patterned. For example, three-dimensional structures such as trenches, pyramids and columns may be formed in the surface of the anode.

The cathode 12 is formed at the carrier. For example, the cathode may be formed adjacent to a top side or a bottom side of the carrier. The cathode may be formed on a support member that is attached to the carrier. The cathode may comprise one or more cathode materials. As a cathode material 159, generally known materials that are used in lithium ion batteries, such as $LiCoO_2$, $LiNiO_2$, $LiNi_{1-x}Co_xO_2$, $Li(NiO_{0.85}Co_{0.1}Al_{0.05})O_2$, $Li(Ni_{0.33}Co_{0.33}Mn_{0.33})O_2$, $LiMn_2O_4$ spinel and $LiFePO_4$. As a further example, the cathode may comprise a matrix of NiCoAl oxide (NCA) including intercalated lithium. The materials forming the cathode may be implemented as a layer formed over a suitable substrate or the carrier.

The carrier 150 comprises an insulating material. For example, the carrier 150 may be made of the insulating material, e.g. an insulating polymer or glass. Alternatively, the carrier may comprise several layers including an insulating layer.

The electrolyte 230 may include electrolytes commonly used for lithium batteries such as e.g. $LiPF_6$, $LiBF_4$ or salts which do not include fluorine such as $LiPCl_6$, $LiClO_4$, in water-free aprotic solvents such as propylene carbonate, dimethyl carbonate or 1,2-dimethoxymethane, ethylene carbonate, diethyl carbonate and others, polymers, for example polyvinylidene fluoride (PVDF) or other polymers, solid electrolytes such as $Li_3PO_4N$ and others. For example, liquid electrolytes may be used, for example, electrolytes that do not withstand high temperatures that are higher than 80° C. As is to be clearly understood, also solid or liquid electrolytes that withstand temperatures higher than 80° C. may be used. As will become apparent from the following description, if fluorine-free salts and fluorine-free solvents are used as electrolytes, problems may be avoided when the housing of the battery includes components made of glass.

The separator element 235 spatially and electrically separates the anode 11 and the cathode 12 from each other.

The separator 235 should be permeable for the ions so that a conversion of the stored chemical energy into electrical energy may be accomplished. Examples of the material of the separator element 235 comprise non-woven fabric made of materials such as fiber glass, polyethylene or microporous materials. Further, membranes which are made of microporous sheet that may comprise several layers may be employed. Further examples comprise non-woven fabric which is coated with a ceramic material. As is to be clearly understood, for example, when the electrolyte is a solid electrolyte, the separator element 235 may be dispensed with.

The battery 2 may be a rechargeable or secondary lithium ion battery. According to a further embodiment, the battery may be a primary battery which is not rechargeable. The battery 2 described herein has an improved capacity for energy storage, since silicon has a large capacity of insertion of lithium. In other words, the amount of lithium atoms that can be stored or inserted in silicon is much larger than in conventional cases. Since—as will be discussed in the following—the first substrate may comprise a semiconductor material, general semiconductor processing methods may be employed. In particular, methods for manufacturing miniaturized sizes can effectively applied for manufacturing a battery having a small size in comparison to conventional batteries. Further, components of an integrated circuit 1 may be easily integrated with the battery 2.

The integrated circuit 1 shown in FIG. 6A may further comprise different circuit elements 340 such as conductive lines 341, 344, resistors 342, transistors 343, and further switches, for example.

The circuit elements 340 may be arranged in or on an arbitrary semiconductor material. For example, they may be arranged adjacent to the second main surface 120 of the first substrate 100 or adjacent to the second main surface 152 of the second substrate 155.

Generally, the length and width of the battery may be in a range of 5 to 15 mm. For example, an area of the battery may be approximately 10 mm×10 mm. The length and the width of the active area 107 may be in a range of 3.5 to 5.5 mm. For example, an area of the active area 107 may be approximately 4.5 mm×4.5 mm. The shape of the battery and of the active area 107 need not be quadratic.

According to the embodiment shown in FIG. 6A, the second substrate 155 and/or the conductive layer 158 laterally extend to the same width as the first semiconductor substrate 100. For example, the second substrate 155 and/or the conductive layer 158 may be stacked over the carrier 150 and the first semiconductor substrate 100 so as to cover the bonding area 108. In this case the adhesive for bonding the carrier 150 to the first semiconductor substrate 100 may be cured by laterally irradiating UV radiation.

Accordingly, the battery 2 may be defined as comprising a first semiconductor substrate 100 having a first main surface 110. The battery further comprises an anode 11 at the first semiconductor substrate 100. The battery further includes a carrier 150 comprising an insulating material, the carrier 150 having a first main surface 153. The battery comprises a cathode 12 at the carrier 150 and a conducting or semiconductor layer 155, 158 over the carrier on a side opposite to the first main surface of the carrier 150 and electrically coupled to the cathode. The conducting or semiconductor layer 155, 158 laterally extends along the entire width of the carrier. The semiconductor substrate 100 and the carrier 150 are stacked so that the first main surface 110 of the first semiconductor substrate is disposed on a side adjacent to the first main surface 153 of the carrier 150. A cavity 130 is formed between the semiconductor substrate 100 and the carrier 150. The battery further comprises an electrolyte 230 in the cavity 130. For example, the conductive layer may be implemented as the second substrate 155 or a conductive layer 158 over the second substrate 155.

Figure 6B:
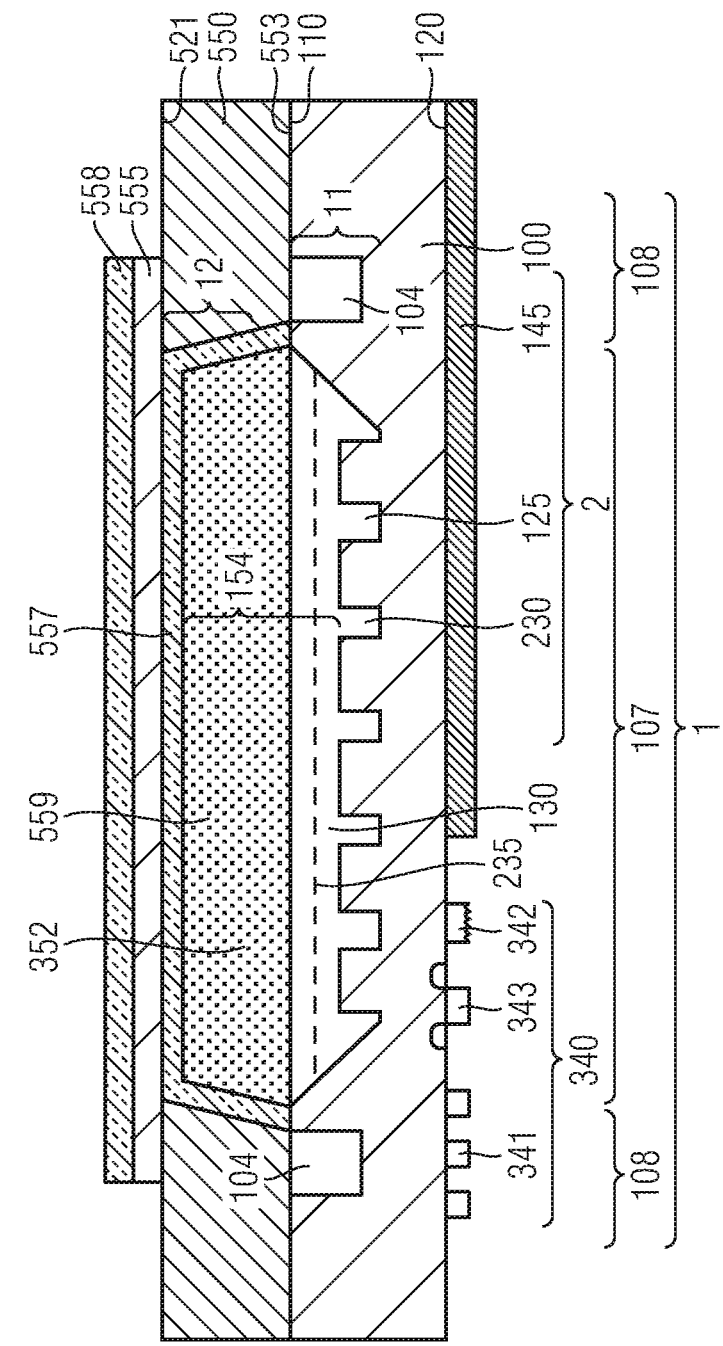

FIG. 6B shows an embodiment of a battery 2 or integrated circuit 1 that may be manufactured using the method that has been explained with reference to FIGS. 5A to 5D, i.e. by irradiating UV radiation from the top side. As is illustrated, the conductive layer 558 and the semiconductor substrate 555 do not entirely extend over the bonding area 108. In more detail, at least an edge portion of the bonding area 108 is not covered by the conductive layer 558 and the semiconductor layer 555 so as to enable UV radiation to irradiate the bonding area from the top. The battery 2 or integrated circuit 1 may further comprise a first and, optionally, a second ditch 104, 105 in the bonding area 108.

Figure 7A:
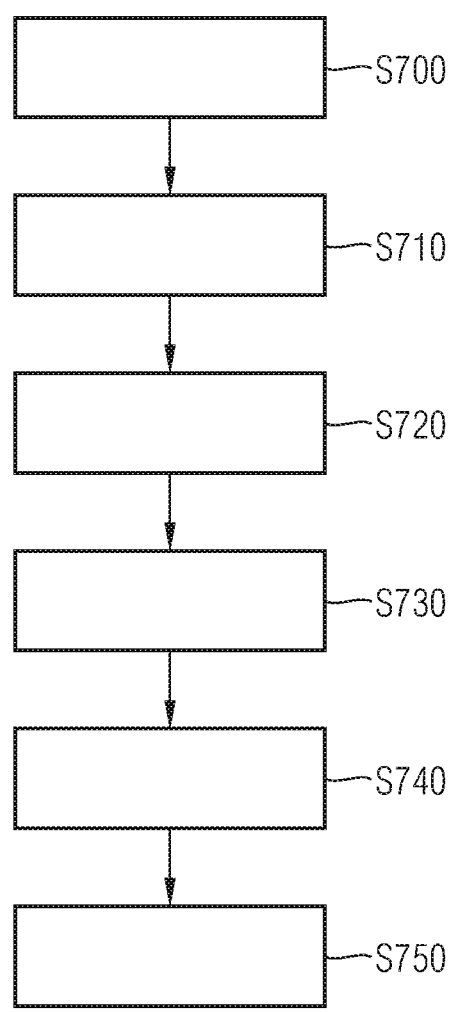
Figure 7B:
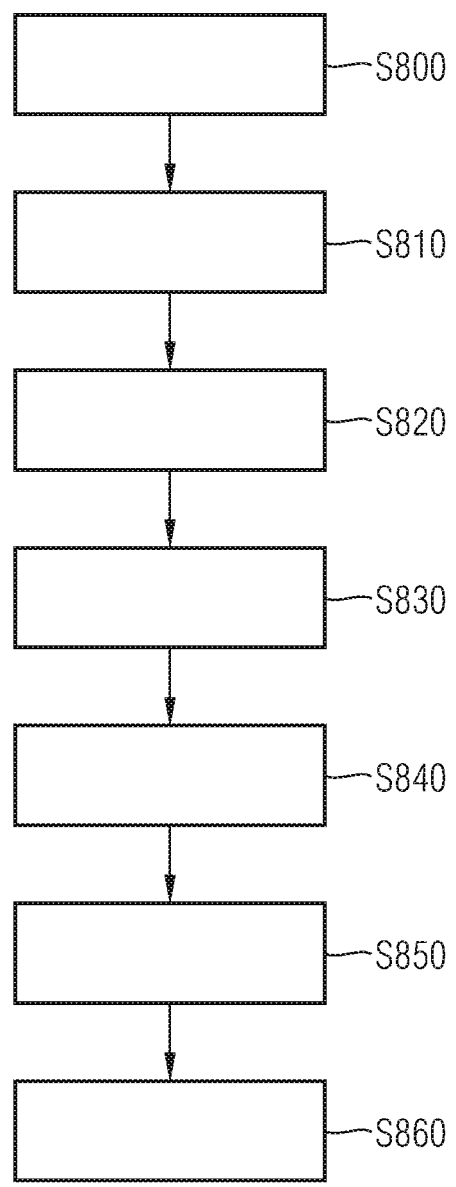

FIGS. 7A to 7C illustrate examples of methods of manufacturing a battery.

As is shown in FIG. 7A, a method of manufacturing a battery, comprises defining an active region and a bonding area in a first main surface of a first semiconductor substrate (S700), forming a first ditch (S710) in the bonding area, forming an anode at the first semiconductor substrate in the active region (S720), forming a cathode at a carrier comprising an insulating material (S730), stacking the first semiconductor substrate and the carrier (S740) so that the first main surface of the first semiconductor substrate is disposed on a side adjacent to a first main surface of the carrier, a cavity being formed between the first semiconductor substrate and the carrier, and forming an electrolyte in the cavity (S750).

As is shown in FIG. 7B, a method of manufacturing a battery comprises defining an active region and a bonding area in a first main surface of a first semiconductor substrate (S800), forming an anode at the first semiconductor substrate (S810) in the active region, forming a cathode at a carrier comprising an insulating material (S820), applying an adhesive to the bonding area (S830), stacking the first semiconductor substrate and the carrier so that the first main surface of the first semiconductor substrate is disposed on a side adjacent to a first main surface of the carrier (S840), a cavity being formed between the first semiconductor substrate and the carrier, curing the adhesive by applying UV-radiation to a sidewall of the carrier (S850), the sidewall being perpendicular to the first main surface of the first semiconductor substrate, and forming an electrolyte in the cavity (S860).

As is shown in FIG. 7C, a method of manufacturing a battery comprises defining an active region and a bonding area in a first main surface of a first semiconductor substrate (S900), forming an anode at the first semiconductor substrate (S910) in the active region, forming a cathode at a carrier comprising an insulating material (S920), applying an adhesive to the bonding area (S930) in a patterned manner, stacking the first semiconductor substrate and the carrier so that the first main surface of the first semiconductor substrate is disposed on a side adjacent to a first main surface of the carrier (S940), a cavity being formed between the first semiconductor substrate and the carrier, and forming an electrolyte in the cavity (S950). The term "applying the adhesive in a patterned manner" is intended to mean that the adhesive is patterned at the point of time it is applied to the bonding area. Examples of methods for applying the adhesive in a patterned manner comprise a printing process such as screen printing, stencil printing or inkjet printing. The adhesive may be a UV curable adhesive but may comprise different types of adhesive such as thermally curable adhesives and others.

The method and the battery described herein may be modified in a variety of manners.

As has been described above with reference to FIGS. 1B and 1C, the second substrate 155 (semiconductor or conducting substrate) may be a planar semiconductor substrate and may be attached to the carrier 150 comprising an insulating material by anodic bonding. According to a modification, the second substrate 155 may be bonded to the carrier 150 by hot embossing. In more detail, a second substrate that may comprise a conductive material such as a metal or an arbitrary semiconductor material such as silicon may be patterned so as to form a protruding portion. The patterned second main surface of the second substrate is bonded to a carrier. For example, the carrier may comprise an insulating layer such as a glass carrier. The carrier may comprise any other transparent materials such as a polymer. The second substrate may be bonded with the carrier, for example, by hot embossing. According to the hot embossing method, the second substrate and the carrier are heated to a temperature above the glass transition point. As a result, the carrier adapts its shape to the surface of the second substrate. Further, the bonded substrates form planar main surfaces. As a result of this processing sequence, the second substrate is embedded into the carrier.

The following figures illustrate further modifications of the battery 2, the integrated circuit 1 and the method of manufacturing the battery. As is to be clearly understood, the semiconductor substrate may further comprise a second ditch 105 in the bonding area.

The upper portion of FIG. 8A shows a carrier 750 into which a portion of the second substrate 755 has been embedded. Bonding the second substrate 755 to the carrier 750 using a hot embossing method results in a compact housing, since the second substrate 755 is embedded into the carrier 750. Optionally, a grinding step, a CMP (chemical-mechanical polishing) step, an etching step or a combination of these processes is performed so as to remove portions of the second substrate 755 that are disposed over a protruding portion of the second main surface of the carrier 750. A resulting surface of the bonded layers include material of the second substrate 755 as well as material of the carrier 750. According to a further option, the second substrate 755 may be maintained and may laterally extend over the entire width of the carrier 750 (not illustrated). Further, an opening 752 is formed in the first main surface 753 of the carrier 750 to uncover a portion of the second main surface 756 of the second substrate 755. A protective conductive layer 757 may be formed over the surface of the resulting opening 752. For example, the protective conductive layer 757 may be made of aluminium (Al).

Then, the material forming the cathode, such as NCA (NiCoAl oxide including intercalated lithium) may be filled in the opening 752. Further, a top metallization contact 158 may be formed over and in contact with the remaining portion of the second substrate 755. As is clearly to be understood, alternatively a portion of the second substrate 755 may be used as a top metallization contact.

An electrolyte 230 may be filled in the depression 130 formed in the first substrate 100 for defining the cavity in the manner as has been explained above with reference to FIG. 1F, followed by forming the separator element 235. Then, the first main surface 753 of the carrier 750 is bonded to the first main surface 110 of the first substrate 100 as indicated by the downward facing arrows in FIG. 8A. For example, this may be accomplished using an UV curable adhesive 160 in the manner as has been explained above with reference to FIGS. 2A to 2D, 3A, 3B and FIG. 4.

FIG. 8B shows an example of a resulting battery 2 or integrated circuit 1. In particular, components of the battery or integrated circuit shown in FIG. 8B are similar to those described above with reference to FIG. 6A. Ditches 104, 105 may be formed in the first semiconductor substrate 100. Differing from the embodiment of FIG. 6A, the second substrate is not disposed so as to have a planar surface but is embedded into the glass carrier 750.

According to still a further embodiment, a conductive cover element 805 such as a metal foil may be attached to the carrier 820 comprising an insulating material. For example, the conductive cover element may comprise a conductive foil 805 that may be a metal foil such as aluminium foil. When implementing the method according to this embodiment, first, a carrier comprising an insulating material such as a glass carrier may be patterned to comprise a recess 825. The conductive cover element 805 may be attached to the carrier 820. Further, a cathode material 810 may be formed in the cavity 825. The cathode material 810 may be directly adjacent and in physical contact with the conductive cover element 805. A primer layer or an adhesive layer may be disposed between the conductive cover element 805 and the cathode material 810. The primer layer (not illustrated) may improve adhesion between the conductive cover element 805 and the cathode material 810. The conductive cover element 805 forms the top surface of the housing of the resulting lithium ion battery 2. The conductive cover element 805 may be metal foil or a conductive metal compound foil, e.g. a conductive metal oxide foil. For example, the material of the conductive foil may comprise a metal alloy. The cathode material 810 is in contact with the electrolyte 230 and implements a lithium source. The carrier 820 comprising the conductive cover element 805 is bonded to a substrate 100 as is indicated by arrows shown in FIG. 9A. The process of bonding the carrier to the first semiconductor substrate may be performed in the manner which has been explained above with the reference to FIGS. 2A to 2D, 3A, 3B and 4.

FIG. 9B shows an example of a resulting structure. As is shown, the carrier 820 comprising an insulating material is bonded to the first semiconductor substrate 100. A conductive cover element 805 is disposed on top of the carrier 820. For example, the conductive cover element 805 may laterally extend along the entire width of the carrier 820 and of the first semiconductor substrate 100. Further elements of the battery 2 or the integrated circuit may be similar as has been discussed above. Ditches 104, 105 may be disposed in the first semiconductor substrate 100.

According to a further embodiment, a cathode 12 may be formed at the first surface 910 of a carrier element 900 comprising an insulating material. Electrical interconnection elements 930 may be disposed in the carrier 900 and extend from the first main surface 910 to the second main surface 920. Conductive elements 940 may be disposed on the second main surface of the carrier 900. For example, forming the electrical interconnection elements may comprise forming via holes in the carrier, e.g. by etching, and filling the via holes with the conductive material. For example, this may be accomplished using screen printing, inkjet printing, a CVD ("chemical vapor deposition") method, electroplating, electroless plating or any other suitable method known from semiconductor processing. According to a further implementation a conducting material that may be made of a metal or a semiconductor material may be embossed into glass. For example, the conductive elements may be pressed into the carrier which is held at a temperature above the glass transition point of the carrier so that the conducting elements may be incorporated in the carrier. According to a further implementation, the carrier material may be reflown onto a conducting material.

Then, for forming the cathode 12, a portion of a cathode material layer 915 is formed on the first main surface 910 of the carrier comprising the insulating material. The cathode material layer 915 may be patterned using commonly known techniques such as photolithographic methods and others. For example, the thickness of the cathode material layer 915 may be 100 to 300 µm. According to a further implementation, the cathode 12 may be formed by applying a conductive paste or by inkjet printing. According to an embodiment, a thin conductive or metal layer may be formed between the cathode material layer 915 and the electrical interconnection element 930.

Figure 10:
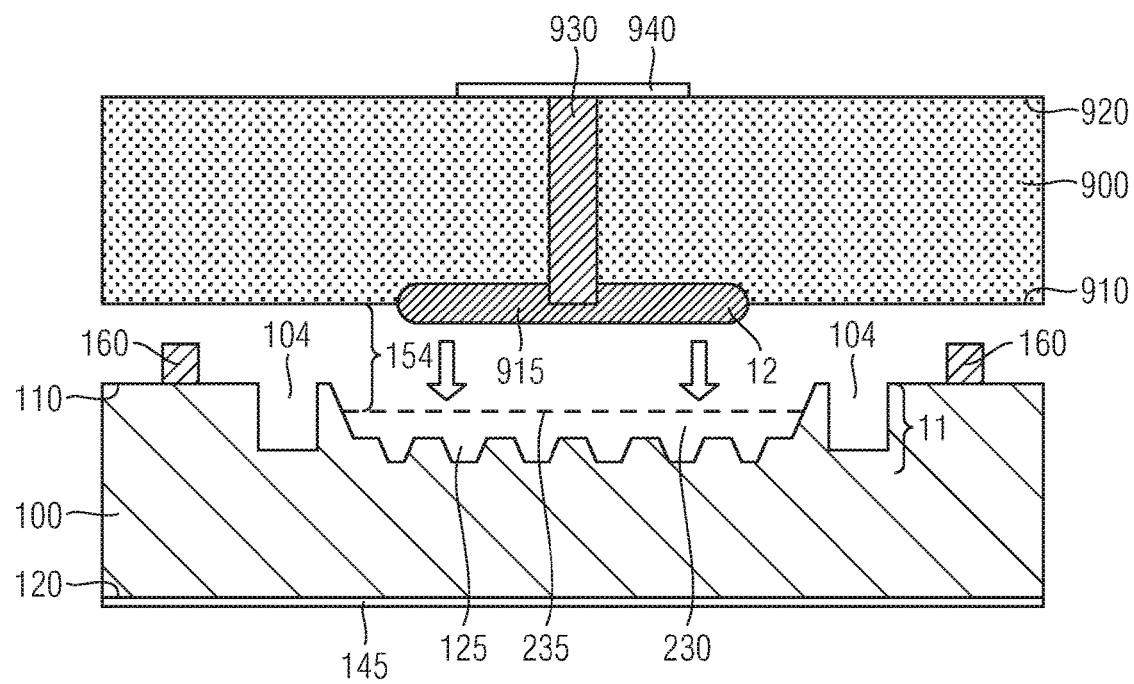
FIG. 10 illustrates a further embodiment of a method of manufacturing a battery.

Thereafter, a back side metallization 940 is formed on the second main surface 920 of the carrier 900. The electrolyte 230 is filled into the cavity, and a separator 235 may be formed in the cavity. Thereafter, the carrier 900 may be bonded to the first semiconductor substrate as is indicated by arrows in FIG. 10. The process of bonding may be performed in a similar manner as has been discussed above with reference to FIGS. 2A to 2D, 3A, 3B and 4. As a result, a further battery comprising similar elements as has been discussed above will be obtained.

Generally, within the context of the present specification, the electric circuit or the integrated circuit may comprise a processing device for processing data. The electric circuit or the integrated circuit may further comprise one or more display devices for displaying data. The electric circuit or the integrated circuit may further comprise a transmitter for transmitting data. The electric device or the integrated circuit may further comprise components which are configured to implement a specific electronic system. According to an embodiment, the electric device or the integrated circuit may further comprise an energy harvesting device that may deliver electrical energy to the battery 2, the energy having been generated from solar, thermal, kinetic or other kinds of energy. For example, the electric device or the integrated circuit may be a sensor such as a tire pressure sensor, wherein the electric circuit or the integrated circuit further comprises sensor circuitry and, optionally, a transmitter that transmits sensed data to an external receiver. According to another embodiment, the electric device or the integrated circuit may be an actuator, an RFID tag or a smartcard. For example, a smartcard may additionally comprise a fingerprint sensor, which may be operated using energy delivered by the battery 2.

While embodiments of the invention have been described above, it is obvious that further embodiments may be implemented. For example, further embodiments may comprise any subcombination of features recited in the claims or any subcombination of elements described in the examples given above. Accordingly, the spirit and scope of the appended claims should not be limited to the description of the embodiments contained herein.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A battery, comprising:
    a first semiconductor substrate having a first main surface, the first main surface comprising an active region and a bonding area, a first ditch being formed in the bonding area, the first ditch having a depth of 100 to 300 µm;
    an anode at the first semiconductor substrate in the active region;
    a carrier comprising an insulating material, the carrier having a first main surface;
    a cathode at the carrier;
    the first semiconductor substrate and the carrier being stacked so that the first main surface of the first semiconductor substrate is disposed on a side adjacent to the first main surface of the carrier, a cavity being formed between the first semiconductor substrate and the carrier, an adhesive being arranged between the carrier and the first semiconductor substrate in the bonding area; and
    an electrolyte in the cavity,
    wherein the first ditch is configured to receive excessive adhesive so that the adhesive does not reach the cavity, and
    wherein the adhesive in the bonding area is completely covered by the insulating material of the carrier.

2. The battery of claim 1, wherein the bonding area encloses the active region.

3. The battery of claim 1, wherein the first ditch encloses the active region.

4. The battery of claim 1, further comprising:
    a second ditch in the bonding area.

5. The battery of claim 1, wherein the bonding area contacts the carrier.

6. The battery of claim 1, wherein the battery is a lithium ion battery, and wherein the anode comprises a silicon material.

7. An integrated circuit, comprising the battery of claim 1 and a circuit element.

8. The integrated circuit of claim 7, wherein the circuit element is formed in the first semiconductor substrate.

9. The integrated circuit of claim 7, wherein the circuit element is formed in a further semiconductor substrate separate from the first semiconductor substrate.

10. The integrated circuit of claim 7, wherein the circuit element is selected from the group consisting of:
    an energy receiving device, an energy emitting device, a signal processing circuit, an information processing circuit, an information storing circuit, a transistor, a capacitor, a resistor, a MEMS (micro-electro-mechanical system) device, a sensor, an actuator, an energy harvester, a device for converting energy, a display device, a video device, an audio device, a music player and components of any of the devices.

11. An electronic device comprising the integrated circuit of claim 7.

12. The electronic device of claim 11, wherein the electronic device is selected from the group consisting of:
    a sensor, an actuator, an RFID (radio frequency identification device) tag and a smartcard.

13. The battery of claim 1, wherein the adhesive is formed as a patterned layer.

* * * * *